United States Patent [19]

Spence

[11] 4,450,368
[45] May 22, 1984

[54] AC COUPLED CHOPPER STABILIZED DIFFERENTIAL COMPARATOR

[75] Inventor: John R. Spence, Villa Park, Calif.

[73] Assignee: Rockwell International Corporation, El Segundo, Calif.

[21] Appl. No.: 332,634

[22] Filed: Dec. 21, 1981

[51] Int. Cl.³ .................... H03K 3/023; H03K 5/24
[52] U.S. Cl. ............................ 307/362; 307/491; 307/497; 307/246; 307/574; 330/9
[58] Field of Search .............. 307/491, 494, 497, 498, 307/501, 520, 529, 356, 548, 554, 246, 572, 574, 581, 583, 355, 362, 242, 243; 328/153, 163, 165, 175; 330/9, 124 R

[56] References Cited

U.S. PATENT DOCUMENTS

| | | | |
|---|---|---|---|
| 4,048,574 | 9/1977 | Barbier et al. | 330/9 |
| 4,190,805 | 2/1980 | Bingham | 330/9 |
| 4,195,266 | 3/1980 | Bingham | 330/9 |
| 4,211,939 | 7/1980 | Furman | 307/497 |
| 4,237,390 | 12/1980 | Buurma | 307/362 |
| 4,264,872 | 4/1981 | Suzuki | 307/355 X |
| 4,331,894 | 5/1982 | Gregorian et al. | 307/497 X |
| 4,392,112 | 7/1983 | Schade, Jr. | 330/9 X |

Primary Examiner—Larry N. Anagnos
Assistant Examiner—David R. Hudspeth
Attorney, Agent, or Firm—H. Fredrick Hamann; Daniel R. McGlynn; James F. Kirk

[57] ABSTRACT

An ac coupled, chopper stabilized differential comparator circuit characterized receiving a differential signal voltage applied between a signal input terminal and a reference signal input terminal, providing differential outputs at a first and second differential output terminal and being characterized as operating from a voltage source with respect to a reference potential comprising: amplifier means, characterized by a first stage differential amplifier having, a first channel amplifier having an input terminal and an output terminal. The first channel amplifier output terminal is connected to the first differential output terminal. The first stage differential amplifier also has a second channel amplifier having an input terminal and an output terminal. The second channel amplifier output terminal is connected to the second differential output terminal. The gain of the second channel amplifier is essentially equal to the gain of the first channel amplifier. A first channel input capacitor having a first and second terminal is included, the second terminal being connected to the first channel amplifier input terminal. A second channel input capacitor is also included, having a first and second terminal, the second terminal being connected to the second channel amplifier input terminal. A clock signal means is included, having a first clock signal and a second clock signal, along with means responsive to the first clock signal for connecting the first and second channel amplifier output terminals to their respective input terminals. Signal input selection means is included for connecting the signal input terminal to the first channel input capacitor first terminal, and for connecting the reference signal input terminal to the second channel input capacitor first terminal, in response to only the first clock signal. The signal input selection means connects the signal input terminal to the second channel input capacitor first terminal and also connects the reference signal input terminal to the first channel input capacitor first terminal in response to the second clock signal; whereby the differential signal voltage between the signal input terminal and the reference signal input terminal is amplified. The amplified differential voltage is provided as a differential output voltage between the first and second channel amplifier output terminals having reduced amplifier offset voltage error.

15 Claims, 3 Drawing Figures

AC COUPLED CHOPPER STABILIZED DIFFERENTIAL COMPARATOR

BACKGROUND OF THE INVENTION

1. Field of the Invention

This invention relates to integrated circuits, and particularly to metal oxide semiconductor large scale integrated circuit (MOS LSI) devices having n-channel or p-channel MOS field effect transistors, such as are commonly used in hand calculators, home and office computers, automotive and industrial control systems and other commercial products. MOS LSI devices use numerous circuit designs to achieve specific functions. One of the circuit designs used in MOS LSI devices is a differential comparator circuit, i.e., a circuit which amplifies the voltage difference between a signal input terminal and a reference signal input terminal. The invention ac coupled, chopper stabilized differential comparator circuit is particularly useful in MOS LSI devices operating in synchronous fashion based on a master clock signal. The invention circuit provides high differential voltage gain through one or more stages of amplification with minimum error from amplifier offset voltage.

2. Description of the Prior Art

Differential comparator circuits are known in the art. MOS LSI versions of these circuits are being used in memory sense amplifier applications. They typically have input sensitivities of 100 millivolts or more. In analog-to-digital converters much higher sensitivities are required. The low drift and good gain matching characteristics required of a differential comparator circuit used for such an application are difficult to obtain using present MOS LSI integrated circuit processing steps.

The invention ac coupled, chopper stabilized differential comparator circuit overcomes the above disadvantages and is easily implemented in MOS LSI circuits using insulated gate field effect transistors (IGFETs) and which require clocked or synchronized operation.

Differential comparators typically have an offset voltage that is unpredictable within a predetermined input voltage range. Connecting the output of a first state differential comparator to the input of a second stage differential comparator results in the offset voltage of the first stage differential comparator being amplified by the second stage differential comparator. The amplified offset voltage is an error voltage tending to mask a valid differential input signal. A third stage differential comparator compounds the error contribution. The invention ac coupled, chopper stabilized differential comparator circuit allows multiple stages of amplification to be used while processing only a small portion of the offset voltage of the first stage with the input signal. The invention circuit requires no trimming and is particularly compatible with manufacturing techniques to implementation in MOS processes for implementing n-channel, p-channel, metal gate or silicon gate devices using single or double polysilicon layers or other known techniques.

SUMMARY OF THE INVENTION

It is, therefore, a major objective of this invention to provide an ac coupled, chopper stabilized differential comparator circuit for use in MOS LSI devices that permits the use of identical compounded stages of amplification.

Another objective of this invention is to substantially reduce the effect of amplifier offset voltage which when amplified masks the amplified valid analog input signal voltage. Another objective of this invention is to provide a circuit particularly compatible with manufacturing techniques and for implementation in MOS LSI processes.

These and other objectives of the invention are realized in an ac coupled, chopper stabilized differential comparator circuit characterized to receive a differential signal voltage applied between a signal input terminal and a reference signal input terminal, providing differential outputs at a first and second differential output terminal and being characterized to operate from a voltage source with respect to a reference potential comprising: amplifier means, characterized by a first stage differential amplifier having a first channel amplifier having an input terminal and an output terminal the first channel amplifier output terminal being connected to the first differential output terminal, and a second channel amplifier having an input terminal and an output terminal, the second channel amplifier output terminal being connected to the second differential output terminal, and having a gain essentially equal to the gain of the first channel amplifier; a first channel input capacitor having a first and second terminal, the second terminal being connected to the first channel amplifier input terminal, a second channel input capacitor, having a first and second terminal, the second terminal being connected to the second channel amplifier input terminal, a clock signal means, having a first clock signal and a second clock signal, means responsive to the first clock signal for connecting the first and second channel amplifier output terminals to their respective input terminals, signal input selection means for connecting the signal input terminal to the first channel input capacitor first terminal, and for connecting the reference signal input terminal to the second channel input capacitor first terminal, in response to only the first clock signal; the signal input selection means connecting the signal input terminal to the second channel input capacitor first terminal and connecting the reference signal input terminal to the first channel input capacitor first terminal, in response to only the second clock signal, whereby the differential signal voltage between the signal input terminal and the reference input terminal is amplified, the amplified differential voltage being provided as a differential output voltage between the first and second channel amplifier output terminals having reduced amplifier offset voltage error.

In a particular embodiment the means for connecting the first and second channel amplifier terminals to their respective input terminals further includes; a first and second channel amplifier output-to-input connecting multiterminal semiconductor device, each respective output-to-input connecting multiterminal semiconductor device having a conduction channel and a control gate, the first output-to-input connecting multiterminal semiconductor device conduction channel being wired to connect the first channel amplifier output terminal to the first channel amplifier input terminal, the second output-to-input connecting multiterminal semiconductor device conduction channel being wired to connect the channel amplifier output terminal to the second channel amplifier input terminal, the first and second output-to-input connecting multiterminal semiconductor device control gates being connected to the clock signal means first clock signal, each respective output-to-input connecting multiterminal semiconductor device conduction channel being conductive only during said first clock signal; the first and second channel amplifiers being further adapted to force their respective input voltages to operate at approximately equal first and second channel amplifier quiescent voltages in response to having their respective channel amplifier output terminals connected to their respective channel amplifier input terminals.

Typically the signal input selection means further includes; a first, second, third and fourth signal selection multiterminal semiconductor device, each respective multiterminal semiconductor device having a conduction channel and a control gate, the first signal selection multiterminal semiconductor device conduction channel being connected between the signal input terminal and the first channel input capacitor first terminal, the second signal selection multiterminal semiconductor device conduction channel being connected between the reference signal input terminal and the second channel input capacitor first terminal, the third signal selection multiterminal semiconductor device conduction channel being connected between the signal input terminal and the second channel input capacitor first terminal, the fourth signal selection multiterminal semiconductor device conduction channel being connected between the reference signal input terminal and the first channel input capacitor first terminal, the first and second signal selection multiterminal semiconductor device control gates being connected to the clock signal means first clock signal, the third and fourth signal selection multiterminal semiconductor device control gates being connected to the clock signal means second clock signal, the first and second multiterminal semiconductor device conduction channels being conductive only during the first clock signal interval, the first channel input capacitor being charged to a first voltage equivalent to the difference between the first channel amplifier quiescent voltage and the signal input terminal voltage, the second channel input capacitor being charged to a first voltage equal to the difference between the second channel amplifier quiescent voltage and the reference signal input terminal voltage, the third and fourth multiterminal semiconductor device conduction channels being conductive only during the second clock signal interval, the first and second channel input capacitor voltages being added during the second clock signal interval to the reference signal input terminal voltage and the signal input terminal voltage respectively, whereby the resultant different voltage between the first channel amplifier input terminal and the second channel amplifier input terminal is approximately doubled.

Generally the clock signal means further comprises a first clock signal having a waveform having a first logic state followed by a second logic state interval approaching a fifty percent duty cycle and the second clock signal having a waveform having a first logic state followed by a second logic state, the first logic state interval approaching a fifty percent duty cycle and being centered and contained within the first clock signal second logic state interval, whereby the first clock signal first logic state interval and the second clock signal first logic state interval repetitively define mutually exclusive timed intervals.

The amplifier means typically includes; a second stage differential amplifier having a first channel amplifier having an input terminal and an output terminal, the first channel amplifier output terminal being connected to the first differential output terminal and a second stage differential amplifier channel amplifier having an input terminal and an output terminal, the second channel amplifier output terminal being connected to the second stage differential amplifier second differential output terminal and having a gain essentially equal to the gain of the second stage differential amplifier first channel amplifier. The amplifier means typically includes a second stage first channel input capacitor having a first and second terminal, the second terminal being connected to the second stage differential amplifier first channel amplifier input terminal, the second stage second channel input capacitor, having a first and second terminal, the second terminal being connected to the second stage differential amplifier second channel amplifier input terminal. The clock signal means typically has a third clock signal, having a waveform having a first logic state followed by a second logic state. The second stage differential amplifier typically includes means responsive to the third clock signal for connecting the second stage differential amplifier first and second channel amplifier output terminals to their respective input terminals, the first stage differential amplifier first channel amplifier output terminal being connected to the second stage first channel input capacitor first terminal, the first stage differential amplifier second channel amplifier output terminal being connected to the second stage second channel input capacitor first terminal, whereby the second stage first channel and second channel input capacitors couple the differential output voltage between the first stage differential amplifier first and second channel amplifier output terminals to the second stage differential amplifier first and second channel amplifier input terminals blocking the first stage differential amplifier first and second channel amplifier offset voltages, the second stage differential amplifier providing additional differential gain.

The means for connecting the second stage differential amplifier first and second channel amplifier outputs to their respective input terminals typically includes; a second stage differential amplifier first and second channel amplifier output-to-input connecting multiterminal semiconductor device, each respective output-to-input connecting multiterminal semiconductor device having a conduction channel and a control gate, these multiterminal devices generally being field effect transistors, the first second stage differential amplifier first channel amplifier output-to-input connecting multiterminal semiconductor device conduction channel being wired to connect the second stage differential amplifier first channel amplifier output terminal to the second stage differential amplifier first channel amplifier input terminal, the second stage differential amplifier second output-to-input connecting multiterminal semiconductor device conduction channel being wired to connect the second stage differential amplifier second channel amplifier output terminal to the second stage differential amplifier second channel amplifier input terminal, the first and second second stage differential amplifier output-to-input connecting multiterminal semiconductor device control gates, generally the gates of FETs, being connected to the clock signal means third clock signal, each respective second stage differential amplifier output-to-input connecting multiterminal semiconductor device conduction channel being conductive only during the third clock signal; the second stage differential amplifier first and second channel amplifiers being further adapted to respond to having their respective output terminals connected to their respective input terminals by forcing their respective input terminal voltages to operate at a first channel amplifier quiescent voltage and a second channel amplifier quiescent voltage respectively, the second stage differential amplifier being further characterized to provide amplification of the differential voltage coupled to the second stage differential amplifier first and second channel amplifier input terminals at the second stage differential amplifier first and second channel amplifier output terminals measured with respect to the quiescent voltages during the clock signal means second clock signal waveform second logic state.

The clock signal means third clock signal first logic state waveform leading edge typically attains a first logic state concurrently with the first clock waveform first logic state waveform, the third clock signal second logic state waveform leading edge occurring simultaneously with the second clock signal first logic state waveform leading edge, whereby the third clock signal provides a waveform having a first logic state commencing with the first clock signal first logic state and ending with the second clock signal first logic state.

In a more particular embodiment, the ac coupled, chopper stabilized differential comparator circuit is characterized to receive a differential signal applied between a signal input terminal and a reference signal input terminal, providing differential outputs at a first and second differential output terminal and is characterized to operate from a voltage source with respect to a reference potential and comprises: amplifier means characterized by a first stage differential amplifier having a first, second, third, fourth, fifth, sixth, seventh, eighth, and ninth multiterminal semiconductor devices, each respective multiterminal semiconductor device having a control gate and a conduction channel having a first and second terminal, the first and fourth multiterminal semiconductor device conduction channel first terminals being connected to the voltage source, the first multiterminal semiconductor device control gate and conduction channel second terminal being connected to the first output terminal, the fourth multiterminal semiconductor device control gate and conduction channel second terminal being connected to the second output terminal, the second and fifth multiterminal semiconductor device conduction channel first terminals being connected to the first output terminal and the second output terminal respectively, the second and fifth multiterminal semiconductor device conduction channel second terminals being connected to the third multiterminal semiconductor device conduction channel first terminal, the third, seventh and ninth multiterminal semiconductor devices having their respective control gates and their respective conduction channel second terminals connected to the reference potential, the sixth and eighth multiterminal semiconductor device conduction channel first terminals being connected to the voltage source, the sixth multiterminal semiconductor device conduction channel second terminal being connected to the seventh multiterminal semiconductor device conduction channel first terminal and to the second multiterminal semiconductor device control gate, the eighth multiterminal semiconductor device conduction channel second terminal being connected to the ninth multiterminal semiconductor device conduction channel first terminal and to the fifth multiterminal semiconductor device control gate, a first channel input capacitor having a first and second terminal, the second terminal being connected to the sixth multiterminal semiconductor device control gate, a second channel input capacitor, having a first and second terminal, the second terminal being connected to the eighth multiterminal semiconductor device control gate, a clock signal means having a first clock signal and a second clock signal, the first clock signal being applied to a first clock signal terminal, and the second clock signal being applied to a second clock signal terminal, the first clock signal typically having a waveform having a first logic state interval followed by a second logic state interval, the first logic state interval approaching a fifty percent duty cycle and a second clock signal having a waveform having a first logic state interval followed by a second logic state interval, the first logic state interval approaching a fifty percent duty cycle and being centered and contained within the first clock signal second logic state interval, the first clock signal first logic state interval and the second clock signal second logic state interval repetitively defining mutually exclusive timed intervals a tenth, eleventh, twelfth, thirteenth, fourteenth and fifteenth multiterminal semiconductor device, each respective multiterminal semiconductor device having a control gate and a conduction channel having a first and second terminal, the tenth multiterminal semiconductor device conduction channel first terminal being connected to the first output terminal, the tenth multiterminal semiconductor device conduction channel second terminal being connected to the sixth multiterminal semiconductor device control gate, the tenth, eleventh, thirteenth and fourteenth multiterminal semiconductor device control gates being connected to the first clock signal terminal, the thirteenth multiterminal semiconductor device conduction channel first terminal being connected to the second output terminal, the twelfth and fifteenth multiterminal semiconductor device control gates being connected to the second clock signal terminal, the eleventh and twelfth multiterminal semiconductor device conduction channel first terminals being connected to the first channel input capacitor first terminal, the fourteenth and fifteenth multiterminal semiconductor device conduction channel first terminals being connected to the second channel input capacitor first terminal, the eleventh and fifteenth multiterminal semiconductor device conduction channel second terminals being connected to the signal input terminal, the twelfth and fourteenth multiterminal semiconductor device conduction channel second terminals being connected to the reference signal input terminal, the thirteenth multiterminal semiconductor device conduction channel second terminal being connected to the eighth multiterminal semiconductor device control gate, the differential signal voltage between the signal input terminal and the reference signal input terminal being amplified, the amplified differential voltage being provided as a differential output voltage between the first and second output terminals having reduced amplifier offset voltage error.

The multiterminal semiconductor devices are typically field effect transistors. More particularly the first, third, fourth, seventh, eighth, field effect transistors are depletion mode devices and the second, fifth, sixth, eighth, tenth, thirteenth, eleventh, twelfth, fourteenth, and fifteenth field effect transistors and enhancement mode devices. In general the field effect transistors are p-channel devices, the voltage source is relatively negative with respect to the reference potential and the first and second clock signal first logic state is relatively negative with respect to the second logic state. The first through fifteenth multiterminal semiconductor devices define the first stage including a signal input selection means and an output-to-input connecting means. A second stage is typically added to the first stage to increase sensitivity. A second stage typically includes; a second stage differential amplifier having a first channel amplifier having an input terminal and an output terminal, the first channel amplifier output terminal being connected to the first differential output terminal, and a second stage differential amplifier second channel amplifier having an input terminal and an output terminal, the second channel amplifier output terminal being connected to the second stage differential amplifier second differential output terminal and having a gain essentially equal to the gain of the second stage differential amplifier first channel amplifier; a second stage first channel input capacitor having a first and second terminal, the second terminal being connected to the second stage differential amplifier first channel amplifier input terminal, a second stage second channel input capacitor, having a first and second terminal, the second terminal being connected to the second stage differential amplifier second channel amplifier input terminal, the clock signal means having a third clock signal having a waveform having a first logic state followed by a second logic state, means responsive to the third clock signal for connecting the second stage differential amplifier first and second channel output terminals to their respective input terminals, the first stage differential amplifier first channel amplifier output terminal being connected to the second stage first channel input capacitor first terminal, the first stage differential amplifier second channel output terminal being connected to the second stage second channel input capacitor first terminal, whereby the second stage first channel and second channel input capacitors couple the differential output voltage between the first stage differential amplifier first and second channel amplifier output terminals to the second stage differential amplifier first and second channel amplifier input terminals blocking the first stage differential amplifier first and second channel amplifier offset voltage, the second stage differential amplifier providing additional differential gain.

BRIEF DESCRIPTION OF THE DRAWINGS

The invention will be further described as to an illustrative embodiment in conjunction with the accompanying drawings in which.

DESCRIPTION OF THE PREFERRED EMBODIMENT

Figure 1:
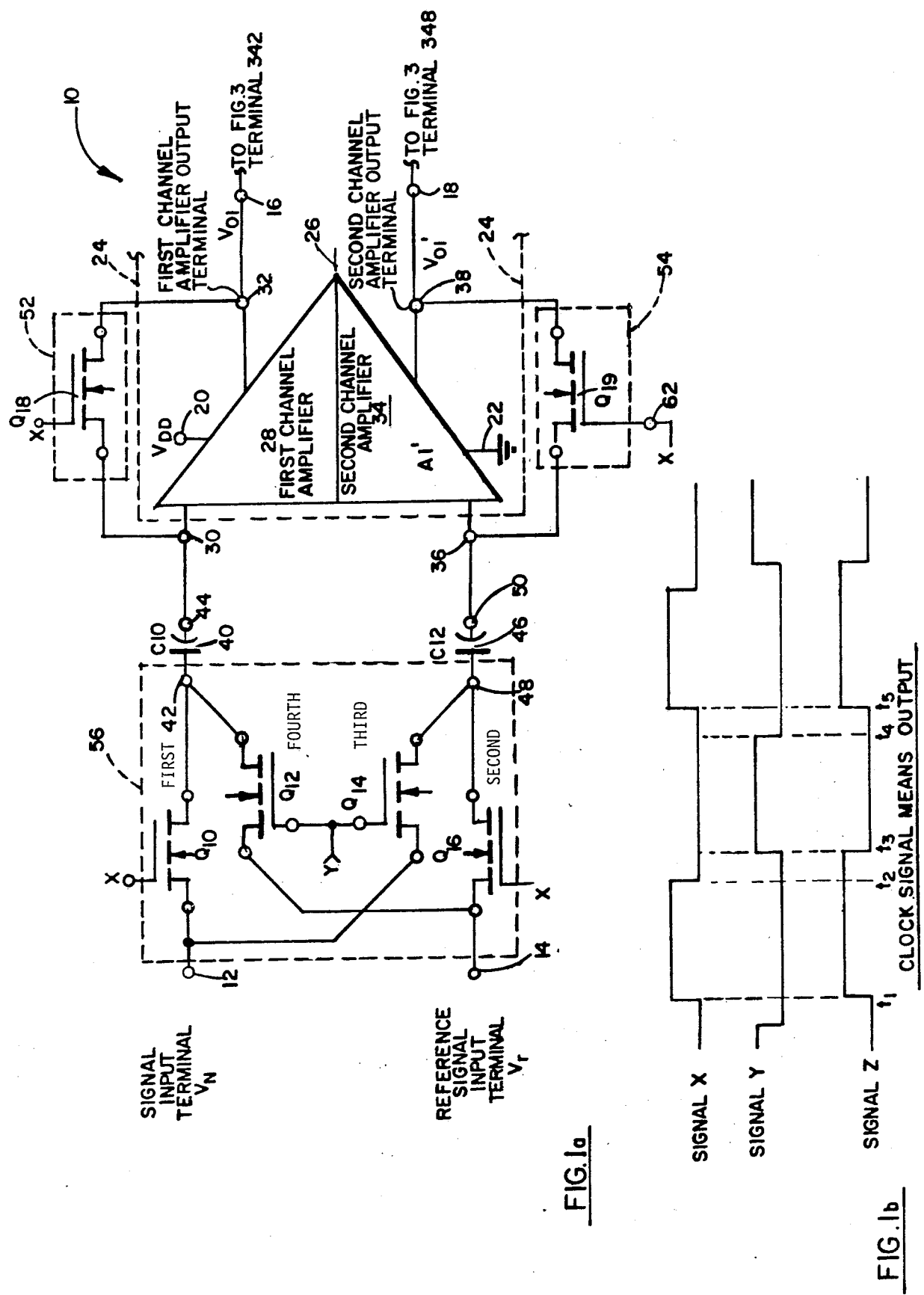
FIG. 1a is a schematic of a typical signal input selection means circuit coupled to a first stage differential amplifier having first and second channels.
FIG. 1b is a clock signal means output.

With reference now to the drawing in detail, in FIG. 1a the ac coupled, chopper stabilized differential comparator 10 is depicted, and is characterized as receiving a differential signal voltage applied between a signal input terminal 12 and a reference signal input terminal 14, providing differential outputs at a first and second differential output terminal 16, 18 and is characterized to operate from a voltage source 20 with respect to a reference potential 22 comprising: amplifier means 24, characterized by a first stage differential amplifier 26 having a first channel amplifier 28 having an input terminal 30 and an output terminal 32, the first channel amplifier output terminal 32 being connected to the first differential output terminal 16. The first stage differential amplifier also has a second channel amplifier 34 having an input terminal 36 and an output terminal 38, the second channel amplifier output terminal 38 being connected to the second differential output terminal 18.

A first channel input capacitor 40 is depicted having a first and second terminal 42, 44, the second terminal 44 being connected to the first channel amplifier input terminal 30, and a second channel input capacitor 46 is shown having a first and second terminal 48, 50, the second terminal 50 being connected to the second channel amplifier input terminal 36.

Figure 2:
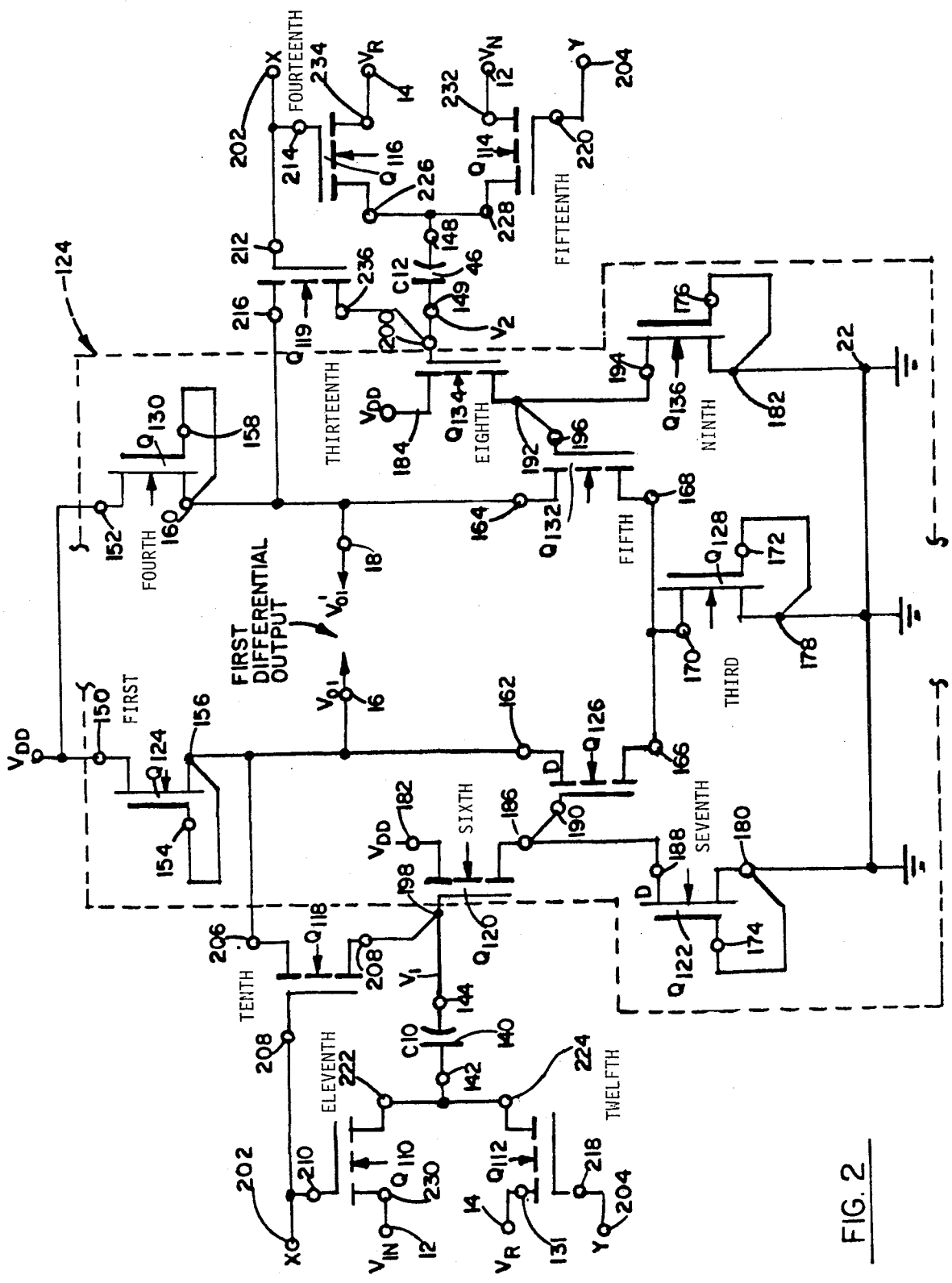
FIG. 2 is a schematic of a signal input selection circuit coupled to a first stage differential amplifier.
Figure 3:
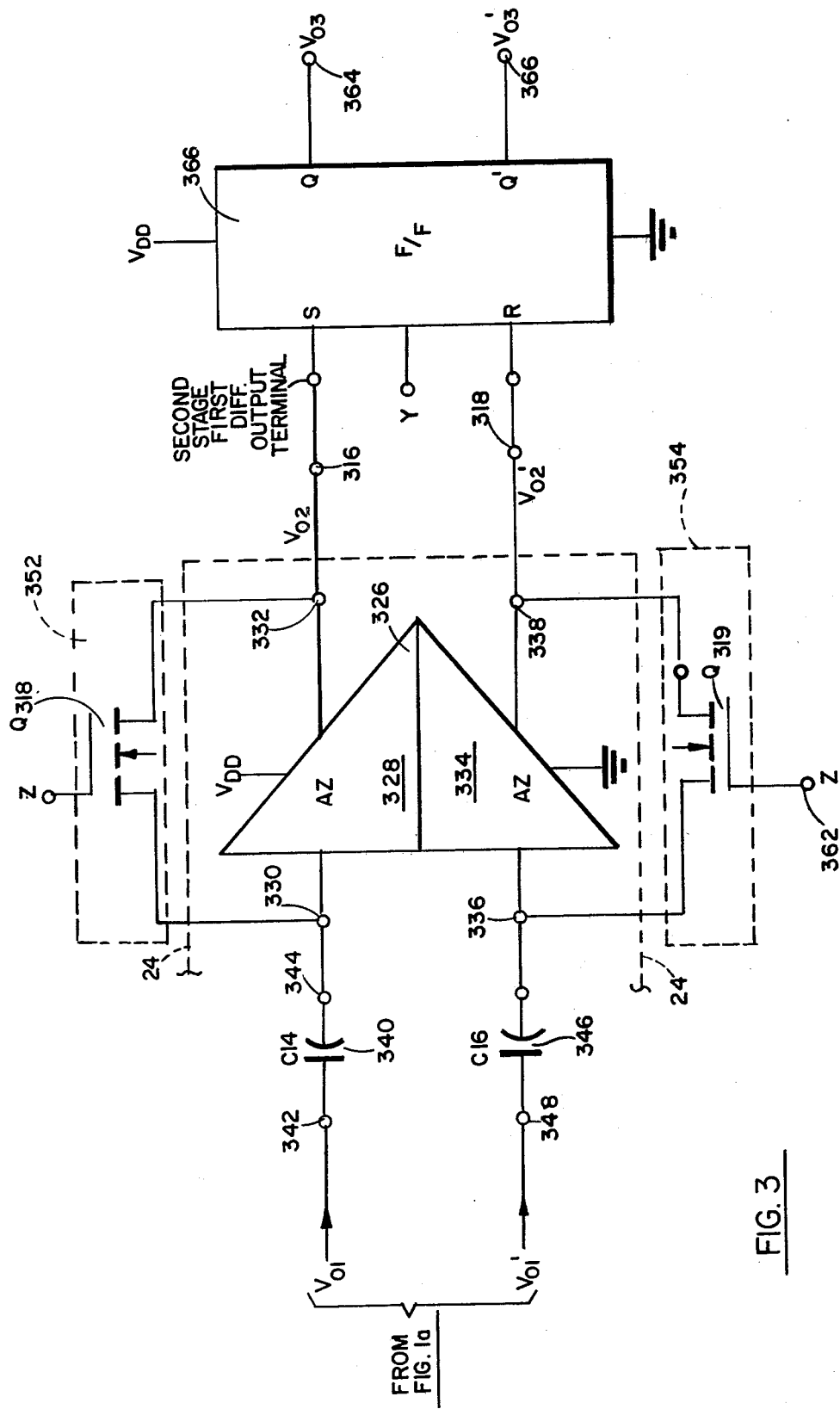
FIG. 3 is a block diagram of an output stage differential amplifier, coupled to a dynamic flip-flop.

FIG. 1b depicts the output from a clock signal means having a first clock signal X, a second clock signal Y and a third clock signal Z. For the purpose of illustrating multi-terminal semiconductor devices having a conduction channel and a control gate FIG. 1a, FIG. 2 and FIG. 3 depict the use of n-channel field effect transistors requiring a VDD voltage source that is positive with respect to the reference potential 22. Referring to FIG. 1b, clock signal first logic state levels are shown to be positive with respect to second logic state levels.

Means 52, 54 responsive to the first clock signal X for connecting the first and second channel amplifier output terminals 32, 38 to their respective input terminals 30, 36, are illustrated in FIG. 1a along with signal input selection means 56 for connecting the signal input terminal 12 to the first channel amplifier input capacitor first terminal 42, and for connecting the reference signal input terminal 14 to the second channel input capacitor first terminal 48, in response to only the first clock signal X: the signal input selection means 56 also connecting the signal input terminal 12 to the second channel input capacitor first terminal 48 and connecting the reference signal input terminal 14 to the first channel input capacitor first terminal 42, in response to only the second clock signal Y.

The means 52, 54 for connecting the first and second channel amplifier output terminals 32, 38 to their respective input terminals 30, 36 further includes; a first and second channel amplifier output-to-input connecting multiterminal semiconductor device Q18, Q19, each respective output-to-input connecting multiterminal semiconductor device having a conduction channel and a control gate, the first output-to-input connecting multi-terminal semiconductor device conduction channel being wired to connect the first channel amplifier output terminal 32 to the first channel amplifier input terminal 30, the second output-to-input connecting multiterminal semiconductor device conduction channel being wired to connect the second channel amplifier output terminal 38 to the second channel amplifier input terminal 36, the first and second output-to-input connecting multiterminal semiconductor device control gates being connected to the first clock signal X, each respective output-to-input connecting multiterminal semiconductor device conduction channel being conductive only during the first clock signal; the first and second channel amplifiers 28, 34 being further adapted to force their respective input voltages to operate at approximately equal first and second channel amplifier quiescent voltages in response to having their respective channel amplifier output terminals 32, 38 connected to their respective channel amplifier input terminals 30, 36.

The signal input selection means generally includes; a first, second, third and fourth signal selection multiterminal semiconductor device Q10, Q16, Q14, Q12 each having a conduction channel and a control gate.

The first signal selection multiterminal semiconductor device conduction channel is shown connected between the signal input terminal 12 and the first channel input capacitor first terminal 42, the second signal selection multiterminal semiconductor device conduction channel is connected between the reference signal input terminal 14 and the second channel input capacitor first terminal 48, the third signal selection multiterminal semiconductor device conduction channel is connected between the signal input terminal 12 and the second channel input capacitor first terminal 48, the fourth signal selection multiterminal semiconductor device conduction channel is connected between the reference signal input terminal 14 and the first channel input capacitor first terminal 42. The first and second signal selection multiterminal semiconductor device control gates are connected to the clock signal means first clock signal X, and the third and fourth signal selection multiterminal semiconductor device control gates are connected to the clock signal means second clock signal Y.

Referring again to FIG. 1b, the clock signal means first clock signal X is depicted having a waveform having a first logic state illustrated in the interval between t1 and t2 followed by a second logic state interval approaching a fifty percent duty cycle in the interval between t2 and t5. The second clock signal Y has a first logic state depicted in the interval from t3 to t4, centered and contained within the first clock signal X second logic state interval.

The clock signal means additionally provides a third clock signal Z, comprising a waveform having a first logic state occurring in the clock interval t1 to t3 and followed by a second logic state in the interval t3 to t5, the first logic state leading edge attaining a first logic state concurrently with the first clock waveform first logic state at t1, the third clock signal second logic state waveform leading edge occurring simultaneously with the second clock signal first logic state waveform leading edge at t3.

FIG. 3 shows an additional stage of amplification used in an alternate embodiment of the invention wherein the amplifier means 24 further includes; a second stage differential amplifier 326 having a first channel amplifier 328 having an input terminal 330 and an output terminal 332, the first channel amplifier output terminal 332 being connected to the first differential amplifier output terminal 316, and a second stage differential amplifier second channel amplifier 334 having an input terminal 336 and an output terminal 338, the second channel amplifier output terminal 338 being connected to the second stage differential amplifier second differential output terminal 318, and having a gain essentially equal to the gain of the second stage differential amplifier first channel amplifier 328.

This alternative embodiment includes a second stage first channel input capacitor 340 having a first and second terminal 342, 344, the second terminal 344 being connected to the second stage differential amplifier first channel amplifier input terminal 330, and a second stage second channel input capacitor 346, having a first and second terminal 348, 350, the second terminal 350 being connected to the second stage differential amplifier second channel amplifier input terminal 336.

This alternative embodiment requires a clock signal means having a third clock signal Z, and means 352, 354 responsive to said third clock signal Z for connecting said second stage differential amplifier first and second channel amplifier output terminals 332, 338 to their respective input terminals 330, 336, the first stage differential amplifier first channel amplifier output terminal 16 being connected to the second stage first channel input capacitor first terminal 342, the first stage differential amplifier second channel amplifier output terminal 18 being connected to the second stage second channel input capacitor first terminal 348, whereby the second stage first channel and second channel input capacitors 340, 346 couple the differential output voltage between the first stage differential amplifier first and second channel amplifier output terminals 16, 18 to the second stage differential amplifier first and second channel amplifier input terminals 342, 348 blocking the first stage differential amplifier first and second channel amplifier offset voltage, the second stage differential amplifier providing additional differential gain.

In an alternative embodiment of the foregoing invention chopper stabilized differential comparator, the means 352, 354 for connecting the second stage differential amplifier first and second channel amplifier outputs 332, 338 to their respective input terminals 330, 336 further includes; a second stage differential amplifier first and second channel amplifier output-to-input connecting multiterminal semiconductor device Q318, Q319, each respective output-to-input connecting multiterminal semiconductor device having a conduction channel and a control gate 360, 362, the second stage differential amplifier first channel amplifier output-to-input connecting multiterminal semiconductor device conduction channel being wired to connect the second stage differential amplifier first channel amplifier output terminal 332 to the second stage differential amplifier first channel amplifier input terminal 330, the second stage differential amplifier second output-to-input connecting multiterminal semiconductor device conduction channel being wired to connect the second stage differential amplifier second channel amplifier output terminal 338 to the second stage differential amplifier second channel amplifier input terminal 336. The first and second second stage differential amplifier output-to-input connecting multiterminal semiconductor device control gates 360, 362 are connected to the clock signal means third clock signal Z, each respective second stage differential amplifier output-to-input connecting multiterminal semiconductor device conduction channel being conductive only during said third clock signal Z; said second stage differential amplifier first and second channel amplifiers being further adapted to respond to having their respective output terminals 332, 338 connected to their respective input terminals 330, 336 by forcing their respective input terminal voltages to operate at a first channel amplifier 328 quiescent voltage and a second channel amplifier 334 quiescent voltage respectively. The second stage differential amplifier 326 is further adapted to provide amplification of the differential voltage coupled to the second stage differential amplifier first and second channel amplifier input terminals at the second stage differential amplifier first and second channel amplifier output terminals measured with respect to the quiescent voltages during the clock means second clock signal waveform first logic state depicted as FIG. 1b as the interval from t3 through t4.

In FIG. 1b, the clock signal means third clock signal Z has a first logic state waveform leading edge that attains a first logic state at t1 concurrently with the first clock waveform X first logic state waveform. The third clock signal Z second logic state waveform leading edge occurs at t3 simultaneously with the second clock signal Y first logic state waveform leading edge; whereby, the third clock signal provides a waveform having a first logic state from t1 through t3. Third clock signal Z, first logic state terminates after the first clock signal X first logic state terminates. FIG. 1b shows the third clock signal Z first logic state termination corresponding with t3. At t2; however, the first stage amplifier differential output voltages typically experience a short term transient excursion. By extending the third clock signal Z first logic state to t3, the gain of the second stage is kept at unity throughout this transient thereby preventing the second stage amplifier from responding to and amplifying the first stage differential output voltage common mode transient error present at t2.

In alternative embodiments the multiterminal semiconductor devices are field effect transistors.

Referring to FIG. 2, another alternative preferred embodiment of an ac coupled, chopper stabilized differential comparator is depicted. This embodiment is adapted to receive a differential signal applied between a signal input terminal 12, the signal being designated as $V_{IN}$, and a reference signal input terminal 14, the reference signal designated as $V_R$, providing differential outputs at a first and second differential output terminal 16, 18 and being characterized to operate from a voltage source VDD with respect to a reference potential, such as ground 22, comprising: amplifier means 124 characterized by a first stage differential amplifier having a first, second, third, fourth, fifth, sixth, seventh, eighth, and ninth multiterminal semiconductor devices, Q124, Q126, Q128, Q130, Q132, Q120, Q122, Q134 and Q136 respectively. Each respective multiterminal semiconductor device is shown having a control gate and a conduction channel having a first and second terminal. The first and fourth multiterminal semiconductor device conduction channel first terminals 150, 152 are connected to the voltage source VDD, the first multiterminal semiconductor device control grid 154 and conduction channel second terminal 156 being connected to the first output terminal 16, the fourth multiterminal semiconductor device control grid 158 and conduction channel second terminal 160 being connected to the second output terminal 18. The second and fifth multiterminal semiconductor device conduction channel first terminals 162, 164 are connected to the first output terminal 16 and second output terminal 18 respectively, the second and fifth multiterminal semiconductor device conduction channel second terminals 166, 168 being connected to the third multiterminal semiconductor device conduction channel first terminal 170. The third, seventh and ninth multiterminal semiconductor devices have their respective control gates 172, 174, 176 and their respective conduction channel second terminals 178, 180, 182 connected to the reference potential, ground 22.

The sixth and eighth multiterminal semiconductor device conduction channel first terminals 182, 184 are connected to the voltage source VDD. The sixth multiterminal semiconductor device conduction channel second terminal 186 is connected to the seventh multiterminal semiconductor device conduction channel first terminal 188 and to the second multiterminal semiconductor device control gate 190. The eighth multiterminal semiconductor device conduction channel second terminal 192 is connected to the ninth multiterminal semiconductor device conduction channel first terminal 194 and to the fifth multiterminal semiconductor device control gate 196.

A first channel input capacitor 140 is depicted having a first and second terminal 142, 144. The second terminal 144 is connected to the sixth multiterminal semiconductor device control gate 198 and a second channel input capacitor 46, having a first and second terminal 148, 149. The second terminal 149 is connected to the eighth multiterminal semiconductor device control gate 200.

A clock signal means provides a first clock signal X to a first clock signal terminal 202 and a second clock signal Y to a second clock signal terminal 204 appearing on the left and right side of FIG. 2.

The tenth, eleventh, twelfth, thirteenth, fourteenth and fifteenth multiterminal semiconductor device Q118, Q110, Q112, Q119, Q116 and Q114 respectively are shown. Each respective multiterminal semiconductor device has a control gate and a conduction channel having a first and second terminal. The tenth multiterminal semiconductor device conduction channel first terminal 206 is connected to the first output terminal 116. The tenth multiterminal semiconductor device conduction channel second terminal 208 is connected to the sixth multiterminal semiconductor device control gate 198. The tenth, eleventh, thirteenth and fourteenth multiterminal semiconductor device control grids 208, 210, 212, and 214 are connected to the first clock signal terminal 202. The thirteenth multiterminal semiconductor device conduction channel first terminal 216 is connected to the second output terminal 18. The twelfth and fifteenth multiterminal semiconductor device control gates 218, 220 are connected to the second clock signal 204. The eleventh and twelfth multiterminal semiconductor device conduction channel first terminals 222, 224 are connected to the first channel input capacitor first terminal 142. The fourteenth and fifteenth multiterminal semiconductor device conduction channel first terminals 226, 228 are connected to the second channel input capacitor first terminal 148. The eleventh and fifteenth multiterminal semiconductor device conduction channel second terminals 230, 232 are connected to the signal input terminal 12. The twelfth and fourteenth multiterminal semiconductor device conduction channel second terminals 231, 234 are connected to the reference signal input terminal 14. The thirteenth multiterminal semiconductor device conduction channel second terminal 236 is connected to the eighth multiterminal semiconductor device control gate 200.

The differential signal voltage between the signal input terminal 12 and the reference signal input terminal 14 is amplified, the amplified differential voltage being provided as a differential output voltage between the first and second output terminals 16, 18 having reduced amplifier offset voltage error.

The clock signal means provides a first clock signal X, as appears in FIG. 1b, having a waveform having a first logic state illustrated in the interval between t1 and t2 followed by a second logic state interval approaching fifty percent duty cycle in the interval between t2 and t5. The second clock signal Y has a first logic state depicted in the interval from t3 to t4, centered and contained within the first clock signal X second logic state interval between t2 and t5. The first clock signal first logic state interval and the second clock signal first logic state interval repetitively define mutually exclusive timed intervals.

In another alternative embodiment of the previously described ac coupled, chopper stabilized differential comparator invention circuit, the multiterminal semiconductor devices are field effect transistors. In a more particular alternative embodiment, the first, third, fourth, seventh, ninth, field effect transistors are depletion mode devices and the second, fifth, sixth, eighth, tenth, thirteenth, eleventh, twelfth, fourteenth, and fifteenth field effect transistors are enhancement mode devices. In a most particular alternative embodiment, the field effect transistors are p-channel devices, the voltage source being relatively negative with respect to the reference potential and the clock signal first logic state is relatively negative with respect to the second logic state.

The gain of the previous alternative embodiment is increased by including one or more additional stages of amplification, each additional stage further including as depicted in FIG. 3, a second stage differential amplifier 326 having a first channel amplifier 328 having an input terminal 330 and an output terminal 332. The first channel amplifier output terminal 332 is connected to the first differential output terminal 316. A second stage differential amplifier second channel amplifier 334 has an input terminal 336 and an output terminal 338, the second channel amplifier output terminal 338 being connected to the second stage differential amplifier second differential output terminal 318 and having a gain essentially equal to the gain of the second stage differential amplifier first channel amplifier 328.

Using conventional MOS LSI processes, amplifier circuits as depicted schematically in FIG. 2 and in block diagram form in FIG. 3 are typically matched in gain to within one percent, and typically provide a differential stage voltage gain of approximately ten. Referring to FIG. 3, second stage first and second channel input capacitors C14, C16 typically have a capacitance of one half pico farad, and are matched in capacitance to within one percent. The second stage first channel input capacitor 340 has a first and second terminal 342, 344. The second terminal 344 is connected to the second stage differential amplifier first channel amplifier input terminal 330. The second stage second channel input capacitor 346, has a first and second terminal 348, 350, the second terminal being connected to the second stage differential amplifier second channel amplifier input terminal 336. The clock signal means has a third clock signal Z, as depicted in FIG. 1b, having a waveform having a first logic state depicted between t1 and t3, and a second logic stage depicted between t3 and t5.

Means 352, 354 are responsive to the third clock signal Z for connecting the second stage differential amplifier first and second channel amplifier output terminals, 332, 338 to their respective input terminals 330, 336. The first stage differential amplifier first channel amplifier output terminal 16 depicted in FIG. 1a is connected to the second stage first channel input capacitor first terminal 342, the first stage differential amplifier second channel amplifier output terminal 18 is connected to the second stage second channel input capacitor first terminal 348, whereby the second stage first and second channel input capacitors 340, 346 couple the differential output voltage between the first stage differential amplifier first and second channel amplifier output terminals 16, 18 to the second stage differential amplifier first and second channel amplifier input terminals 330, 336, blocking the first stage differential amplifier first and second channel amplifier offset voltage. The second stage differential amplifier provides additional differential voltage gain.

A preferred embodiment of the invention has been reduced to practice that used a first and second stage of amplification, that achieved a five millivolt sensitivity operating on a MOS LSI device supplied with a one hundred kilohertz clock. Clock signal first logic state and second logic state durations of one to ten microseconds have been demonstrated to be practical.

FIG. 3 shows the differential outputs 316, 318 connected to the inputs of a dynamic flip flop. MOS LSI dynamic flip flops are typically capable of resolving a difference signal of more than one tenth volt reliably into a first or second logic state. The flip flop is responsive to the differential output signal at the first and second differential output terminals 316, 318 when enabled by the second clock signal Y. The flip flop output is provided at output terminal 364. The complement output is provided at the complement output terminal 366. The flip flop output is set to a first or second logic state during the second clock signal Y and remains unchanged until the next second clock signal Y. An analog-to-digital converter system typically uses a differential amplifier in determining whether to set or not set a next least significant bit in successively approximating a digital output corresponding to an analog input signal. The ac coupled chopper stabilized differential comparator output flip flop provides a means for storing a first or second logic state providing the control required to set or not set the next least significant ladder switch as required in a successive approximation analog-to-digital system.

Referring to FIG. 2, FETs Q110, Q116, Q114 and Q112 define signal input selection means first, second, third and fourth signal selection multiterminal semiconductor devices respectively and correspond to FETs Q10, Q16, Q14 and Q12 respectively shown in FIG. 1a. Referring to FIG. 2, FETs Q118 and Q119 define first and second channel amplifier output to input connecting multiterminal semiconductor devices respectively corresponding to Q18 and Q19 shown in FIG. 1a. Referring to FIG. 2 capacitors C110 and C112 define a first and second channel input capacitor respectively corresponding to C10 and C12 respectively in FIG. 1a.

Circuit Operation

Referring to FIG. 2, as first clock signal X first logic state is applied to the gate 210 of Q110 and the gate 208 of Q118 and to the gate 214 of Q116 and the gate 212 of Q119, each of these FETs become conductive. First signal selection FET Q110 connects signal input terminal 12 to first channel input capacitor C110 first terminal 142 as the first output-to-input connecting FET Q118 connects the first channel amplifier output terminal 16 to the first channel input capacitor C110 second terminal 144 and to the first channel source follower FET Q120 gate 198. FET Q118 forces the voltage at the Q120 gate 198 to equal the voltage at the first channel amplifier output terminal 16. FET Q124 is a depletion mode FET operating in the saturated mode and provides bias current to FET Q126 drain 162. First channel amplifier FET Q120 drain 182 is connected to voltage source $V_{DD}$. The Q120 source 186 is connected to the Q122 drain 188, Q122 operating in the saturated mode as a current source providing a current path to the voltage reference 22 ground. As the output voltage $V_{01}$ at first channel amplifier output terminal 16 increases in a positive sense, the increase is fed through conducting FET Q118 to Q120 gate 198 causing Q120 to become more conductive and causing a positive rise in potential at Q126 gate 190. A positive rise in potential at Q126 gate 190 increases the conductivity of FET Q126 dropping the voltage at first channel amplifier output terminal 16. FET Q128 operates in the saturated mode as a common current source for both the first and second channel amplifier circuits. As the conductivity of FET Q126 is increased and the current through FET Q126 is increased correspondingly, the voltage at Q128 drain 170 increases slightly thereby increasing the voltage at Q132 source 168. An increase of voltage at Q132 source 168 produces a decrease in the gate 196 to source 168 voltage of Q132 thereby decreasing the conductivity of Q132 tending to produce an increase in voltage at the second channel amplifier output terminal 18.

Second channel output-to-input connecting FET Q119 is conductive during first clock signal X first period and connects second channel amplifier output terminal 18 to Q134 gate 200 and second channel input capacitor C112 second terminal 149. Second signal selection FET Q116 is also conductive and connects reference signal input terminal 14 to the second channel input capacitor first terminal 148. Conductive FET Q116 forces the second channel source follower FET Q134 gate 200 voltage to equal the second channel differential output terminal 18 quiescent voltage. A slight increase in voltage at the output terminal 18 forces a slight increase in the Q134 gate 200 voltage thereby increasing the conductivity of FET Q134. A slight increase in the conductivity of FET Q134 raises the voltage at Q134 source 192 and Q132 gate 196 thereby increasing the conductivity of FET Q132. Increased conductivity of FET Q132 reduces the voltage at second channel differential output terminal 18.

FET Q136 is a depletion mode FET operating in the saturated mode and acts as a load for source follower FET Q134. Depletion mode FET Q122 is also operating in the saturated mode as a load for source follower FET Q120. Source follower FET Q120 and source follower FET Q134 each have voltage gains at their respective sources 186, 192 approaching unity with respect to voltage changes at their respective gates 198, 200.

As the first clock signal X first logic state concludes, the voltage across the first channel input capacitor second terminal 144 measured with respect to the first terminal 142 is $V_{01}$ minus $V_N$ while the voltage across the second channel input capacitor second terminal 149 with respect to the first terminal 148 is $V_{Q2}$ minus $V_R$ where $V_{Q1}$ and $V_{Q2}$ are the respective quiescent voltages of the first and second channel amplifier circuits and $V_N$ and $V_R$ are the signal input terminal voltage at terminal 12 and the reference signal input terminal voltage at terminal 14 respectively.

As the first logic signal second logic state starts, FETs Q110, Q118, Q119 and Q116 become non conductive isolating first and second channel input capacitors C110 and C112. These capacitors retain their respective charges without change until the start of the next first clock signal X first logic state. At the start of the second clock signal Y first logic state commencing shortly after the first clock signal X first logic state, the third signal selection multiterminal semiconductor device Q114 is conductive connecting the signal input terminal 12 to the second channel input capacitor first terminal 148 while concurrently the fourth signal selection multiterminal semiconductor device FET Q112 is conductive connecting the reference signal input terminal 14 to the first channel input capacitor C110 first terminal 142. Throughout the second clock signal first logic state the voltage at the first channel amplifier input terminal 198 is therefore:

$$V_1 = V_{Q1} - V_N + V_R$$

The voltage at the corresponding second channel amplifier input terminal, Q134 gate 200, is therefore:

$$V_2 = V_{Q2} - V_R + V_N$$

The amplifier circuit amplifies the difference voltage $V_1$ minus $V_2$ with a gain of A where A is typically a value of ten or more. The amplifier quiescent voltages are approximately equal if the amplifiers are made on the semiconductor die as is customary in MOS LSI circuits. The resulting expression for the gain of the first stage of the amplifier differential output voltage $V01 - v01'$ measured during the second clock signal Y first logic state at first and second differential output terminals 16 and 18 respectively are obtained by the following analysis: The first channel amplifier, comprised of Q124, Q120 Q126 Q122 and Q128 amplifies the voltage difference between the first channel amplifier quiescent voltage VQ1 and the above obtained voltage V1 applied to the Q120 gate 198 with a gain of $-A$, where A is typically 10 or more. Therefore: $V01 = -A (V1 - VQ1)$ Substituting for V1 above and combining: $V01 = -A(-VN + VR)$.

The second channel amplifier, comprised of Q130, Q134, Q132, Q136 and Q128 correspondingly amplifies the voltage difference between the second channel amplifier quiescent voltage VQ2 and the above obtained voltage V2 applied to the Q134 gate 200, having a gain of $-A$ is:

$$V01' = -A(V2 - VQ2)$$

Substituting the above expression for V2 and combining terms provides:

$$V01' = -A(-VR + VN)$$

The first stage gain expression for the differential output voltage measured at terminal 16 with respect to terminal 18 is therefore:

$$V01 - V01' = -A(-VN + VR) + A(-VR + VN)$$

or $$V01 - V01' = -2A(VR - VN)$$

A single stage amplifier means having a first and second channel amplifier each having a typical gain of 10 thereby provides a differential gain of 20. A subsequent stage, as depicted in FIG. 3, and having a typical gain of 20 thereby provides a total typical gain of 400 for an amplifier means having two stages.

The second stage differential amplifier of FIG. 3 is depicted providing outputs to dynamic flip-flop 366. The invention contemplates that alternative embodiments requiring additional sensitivity will include a third or fourth or more additional stages as required. Each added stage will have coupling capacitors comparable to C14 and C16, a first and second channel amplifier comparable to amplifier 328 and 334 and a first and second output-to-input connecting FET comparable to Q318 and Q319. Amplifiers 328 and 334 are typically implemented using the differential amplifier circuit characterized in FIG. 2 by FETs Q124, Q120, Q126 Q122, Q128, Q130, Q134 Q132, and Q136 having first and second output-to-input connecting FETs comparable to Q118 and Q119.

Referring to FIG. 3, signal Z is applied to Q318 gate 360 and Q319 gate 362 forcing these FETs to be conductive from t1 to t3 thereby forcing the channel amplifier input terminals 330, 336 and the coupling capacitor second terminals 334, 350 to assume the respective second stage channel amplifier quiescent voltages. During the interval t1 to t2 the first stage amplifier forces the coupling capacitors first terminals 342, 348 to assume the first stage quiescent voltage. The coupling capacitors charge to a voltage difference equal to the difference between the quiescent voltages of the respective first and second stage channel amplifiers. Offset differences between series connected amplifiers are blocked by operation of the charge imposed on the coupling capacitors in the interval t1 to t2. In a 100 KHz clock signal system, the time between t2 and t3 is typically one microsecond. At t3, signal Y enables the first stage amplifier. An amplified voltage difference signal begins propagating through the first stage at the same instant that clock signal Z opens FETs Q318 and Q319 enabling the second stage to process the output of the first stage amplifier at terminals 342, 348. During the interval t3 to t4, the second stage provides a differential output voltage between terminals 316 and 318.

There is thus provided an ac coupled chopper stabilized differential comparator circuit useful in the design of MOS LSI devices. The invention circuit is adapted to n-channel and p-channel process and is particularly suited for use with analog-to-digital converter circuits requiring a stable, high gain differential comparator. The description provided is intended to be illustrative only and is not intended to be limitative. Those skilled in the art may conceive of modifications, but those modifications which fall within the purview of the description are intended to be included therein as well.

What is claimed is:

1. An ac coupled differential comparator circuit characterized as receiving a differential signal voltage applied between a signal input terminal and a reference signal input terminal, providing differential outputs at a first and second differential output terminal and being characterized as operating from a voltage source with respect to a reference potential comprising:

amplifier means, characterized by a first stage differential amplifier having a first channel amplifier having an input terminal and an output terminal, said first channel amplifier output terminal being connected to said first differential output terminal, and a second channel amplifier having an input terminal and an output terminal, said second channel amplifier output terminal being connected to said second differential output terminal, and having a gain essentially equal to the gain of said first channel amplifier;

a first channel input capacitor having a first and second terminal, said second terminal being connected to said first channel amplifier input terminal, a second channel input capacitor, having a first and second terminal, said second terminal being connected to said second channel amplifier input terminal, a clock signal means, having a first clock signal and a second clock signal, means responsive to said first clock signal for connecting said first and second channel amplifier output terminals to their respective input terminals, signal input selection means for connecting said signal input terminal to said first channel input capacitor first terminal, and for connecting said reference signal input terminal to said second channel input capacitor first terminal, in response to only said first clock signal, said signal input selection means connecting said signal input terminal to said second channel input capacitor first terminal and connecting said reference signal input terminal to said first channel input capacitor first terminal, in response to only said second clock signal, whereby said differential signal voltage between said signal input terminal and said reference signal input terminal is amplified, said amplified differential voltage being provided as a differential output voltage between said first and second channel amplifier output terminals having reduced amplifier offset voltage error.

2. The combination in accordance with claim 1, wherein said means for connecting said first and second channel amplifier output terminals to their respective input terminals further includes;

a first and second channel amplifier output-to-input connecting multiterminal semiconductor device, each respective output-to-input connecting multiterminal semiconductor device having a conduction channel and a control gate, said first output-to-input connecting multiterminal semiconductor device conduction channel being wired to connect said first channel amplifier output terminal to said first channel amplifier input terminal, said second output-to-input connecting multiterminal semiconductor device conduction channel being wired to connect said second channel amplifier output terminal to said second channel amplifier input terminal, said first and second output-to-input connecting multiterminal semiconductor device control gates being connected to said clock signal means first clock signal, each respective output-to-input connecting multiterminal semiconductor device conduction channel being conductive only during said first clock signal;

said first and second channel amplifiers being further characterized as forcing their respective input voltages to operate at approximately equal first and second channel amplifier quiescent voltages in response to having their respective channel amplifier output terminals connected to their respective channel amplifier input terminals.

3. The combination in accordance with claim 2, wherein said signal input selection means further includes;
- a first, second, third and fourth signal selection multiterminal semiconductor device, each respective multiterminal semiconductor device having a conduction channel and a control gate,
- said first signal selection multiterminal semiconductor device conduction channel being connected between said signal input terminal and said first channel input capacitor first terminal,
- said second signal selection multiterminal semiconductor device conduction channel being connected between said reference signal input terminal and said second channel input capacitor first terminal,
- said third signal selection multiterminal semiconductor device conduction channel being connected between said signal input terminal and said second channel input capacitor first terminal,
- said fourth signal selection multiterminal semiconductor device conduction channel being connected between said reference signal input terminal and said first channel input capacitor first terminal,
- said first and second signal selection multiterminal semiconductor device control gates being connected to said clock signal means first clock signal,
- said third and fourth signal selection multiterminal semiconductor device control gates being connected to said clock signal means second clock signal,
- said first and second multiterminal semiconductor device condition channels being conductive during only said first clock signal interval,
- said first channel input capacitor being charged to a first voltage voltage equivalent to the difference between said first channel amplifier quiescent voltage and said signal input terminal voltage,
- said second channel input capacitor being charged to a first voltage equal to the difference between said second channel amplifier quiescent voltage and said reference signal input terminal voltage,
- said third and fourth multiterminal semiconductor device conduction channels being conductive only during said second clock signal interval,
- said first and second channel input capacitor voltages being added during said second clock signal interval to said reference signal input terminal voltage and said signal input terminal voltage respectively,
- whereby the resultant difference voltage between said first channel amplifier input terminal and said second channel amplifier input terminal is approximately doubled.

4. The combination in accordance with claim 3, wherein said clock signal means further comprises a first clock signal having a waveform having a first logic state followed by a second logic state interval approaching a fifty percent duty cycle and
- a second clock signal having a waveform having a first logic state followed by a second logic state, said first logic state interval approaching a fifty percent duty cycle and being centered and contained within said first clock signal second logic state interval,
- whereby said first clock signal first logic state interval and said second clock signal first logic state interval repetitively define mutually exclusive timed intervals.

5. The combination in accordance with claim 4, wherein said amplifier means further includes;
- a second stage differential amplifier having
  - a second stage differential amplifier first channel amplifier having an input terminal and an output terminal, said first channel amplifier output terminal being connected to said second stage differential amplifier first differential output terminal, and
  - a second stage differential amplifier second channel amplifier having an input terminal and an output terminal, said second channel amplifier output terminal being connected to said second stage differential amplifier second differential output terminal and having a gain essentially equal to the gain of said second stage differential amplifier first channel amplifier;
- a second stage first channel input capacitor having a first and second terminal, said second terminal being connected to said second stage differential amplifier first channel amplifier input terminal,
- a second stage second channel input capacitor, having a first and second terminal, said second terminal being connected to said second stage differential amplifier second channel amplifier input terminal,
- said clock signal means having a third clock signal having a waveform having a first logic state followed by a second logic state,
- means responsive to said third clock signal for connecting said second stage differential amplifier first and second channel amplifier output terminals to their respective input terminals,
- said first stage differential amplifier first channel amplifier output terminal being connected to said second stage first channel input capacitor first terminal,
- said first stage differential amplifier second channel amplifier output terminal being connected to said second stage second channel input capacitor first terminal,
- whereby said second stage first channel and second channel input capacitors couple said differential output voltage between said first stage differential amplifier first and second channel amplifier output terminals to said second stage differential amplifier first and second channel amplifier input terminals blocking said first stage differential amplifier first and second channel amplifier offset voltage,
- said second stage differential amplifier providing additional differential gain.

6. The combination in accordance with claim 5, wherein said means for connecting said second stage differential amplifier first and second channel amplifier outputs to their respective input terminals further includes;
- a second stage differential amplifier first and second channel amplifier output-to-input connecting multiterminal semiconductor device, each respective output-to-input connecting multiterminal semiconductor device having a conduction channel and a control gate,
- said first second stage differential amplifier first channel amplifier output-to-input connecting multiterminal semiconductor device conduction channel being wired to connect said second stage differential amplifier first channel amplifier output terminal to said second stage differential amplifier first channel amplifier input terminal, said second stage differential amplifier second output-to-input connecting multiterminal semiconductor device conduction channel being wired to connect said second stage differential amplifier second channel amplifier output terminal to said second stage differential amplifier second channel amplifier input terminal, said first and second second stage differential amplifier output-to-input connecting multiterminal semiconductor device control gates being connected to said clock signal means third clock signal, each respective second stage differential amplifier output-to-input connecting multiterminal semiconductor device conduction channel being conductive only during said third clock signal;

said second stage differential amplifier first and second channel amplifiers being further characterized as responding to having their respective output terminals connected to their respective input terminals by forcing their respective input terminal voltages to operate at a first channel amplifier quiescent voltage and a second channel amplifier quiescent voltage respectively, said second stage differential amplifier being further characterized as providing amplification of the differential voltage coupled to said second stage differential amplifier first and second channel amplifier input terminals at said second stage differential amplifier first and second channel amplifier output terminals measured with respect to said quiescent voltages during said clock signal means second clock signal waveform second logic state.

7. The combination in accordance with claim 6, wherein said clock signal means third clock signal first logic state waveform leading edge attains a first logic state concurrently with said first clock waveform first logic state waveform, said third clock signal second logic state waveform leading edge occurring simultaneously with said second clock signal first logic state waveform leading edge, whereby, said second stage output-to-input connecting multiterminal semiconductor devices being conductive in response to said third clock signal first logic state, for a period in excess of said first clock signal first logic state, operates to restrict said second stage amplifier from responding to first stage amplifier common mode transient voltage errors corresponding to termination of said first clock signal first logic state; said second stage output-to-input connecting multiterminal semiconductor devices being non-conductive in response to said third clock signal second logic state, operating to enable said second stage differential amplifier to amplify said first stage differential amplifier output voltage.

8. The combination in accordance with claim 7, wherein said multiterminal semiconductor devices are field effect transistors.

9. An ac coupled, chopper stabilized differential comparator characterized by receiving a differential signal applied between a signal input terminal and a reference signal input terminal, providing differential outputs at a first and second differential output terminal and being characterized by operating from a voltage source with respect to a reference potential comprising:

amplifier means characterized by a first stage differential amplifier having a first, second, third, fourth, fifth, sixth, seventh, eighth, and ninth multiterminal semiconductor device, each respective multiterminal semiconductor device having a control gate and a conduction channel having a first and second terminal, said first and fourth multiterminal semiconductor device condition channel first terminals being connected to said voltage source, said first multiterminal semiconductor device control gate and conduction channel second terminal being connected to said first output terminal, said fourth multiterminal semiconductor device control gate and conduction channel second terminal being connected to said second output terminal, said second and fifth multiterminal semiconductor device conduction channel first terminals being connected to said first output terminal and said second output terminal respectively, said second and fifth multiterminal semiconductor device conduction channel second terminals being connected to said third multiterminal semiconductor device conduction channel first terminal, said third, seventh and ninth multiterminal semiconductor devices having their respective control gates and their respective conduction channel second terminals connected to said reference potential, said sixth and eighth multiterminal semiconductor device conduction channel first terminals being connected to said voltage source, said sixth multiterminal semiconductor device conduction channel second terminal being connected to said seventh multiterminal semiconductor device conduction channel first terminal and to said second multiterminal semiconductor device control gate, said eighth multiterminal semiconductor device conduction channel second terminal being connected to said ninth multiterminal semiconductor device conduction channel first terminal and to said fifth multiterminal semiconductor device control gate, a first channel input capacitor having a first and second terminal, said second terminal being connected to said sixth multiterminal semiconductor device control gate, a second channel input capacitor, having a first and second terminal, said second terminal being connected to said eighth multiterminal semiconductor device control gate, a clock signal means, having a first clock signal and a second clock signal, said first clock signal being applied to a first clock signal terminal and said second clock signal being applied to a second clock signal terminal, a tenth, eleventh, twelfth, thirteenth, fourteenth and fifteenth multiterminal semiconductor device, each respective multiterminal semiconductor device having a control gate and a conduction channel having a first and second terminal, said tenth multiterminal semiconductor device conduction channel first terminal being connected to said first output terminal, said tenth multiterminal semiconductor device conduction channel second terminal being connected to said sixth multiterminal semiconductor device control gate, said tenth, eleventh, thirteenth and fourteenth multiterminal semiconductor device control gate being connected to said first clock signal terminal, said thirteenth multiterminal semiconductor device conduction channel first terminal being connected to said second output terminal, said twelfth and fifteenth, multiterminal semiconductor device control gates being connected to said second clock signal terminal, said eleventh and twelfth multiterminal semiconductor device conduction channel first terminals being connected to said first channel input capacitor first terminal, said fourteenth and fifteenth multiterminal semiconductor device conduction channel first terminals being connected to said second channel input capacitor first terminal, said eleventh and fifteenth multiterminal semiconductor device conduction channel second terminals being connected to said signal input terminal, said twelfth and fourteenth multiterminal semiconductor device conduction channel second terminals being connected to said reference signal input terminal, said thirteenth multiterminal semiconductor device conduction channel second terminal being connected to said eighth multiterminal semiconductor device control gate, whereby said differential a signal voltage between said signal input terminal and said reference signal input terminal is amplified, said amplifier differential voltage being provided as a differential output voltage between said first and second output terminals having reduced amplifier offset voltage error.

10. The combination in accordance with claim 9, wherein said clock signal means further comprises a first clock signal having a waveform having a first logic state interval followed by a second logic state interval, said first logic state interval approaching a fifty percent duty cycle and a second clock signal having a waveform having a first logic state interval followed by a second logic state interval, said first logic state interval approaching fifty percent duty cycle and being centered and contained within said first clock signal second logic state interval, whereby said first clock signal first logic state interval and said second clock signal second logic state interval repetitively define mutually exclusive timed intervals.

11. The combination in accordance with claim 10, wherein said multiterminal semiconductor devices are field effect transistors.

12. The combination in accordance with claim 11, wherein said first, third, fourth, seventh, ninth, field effect transistors are depletion mode devices, and wherein said second, fifth, sixth, eighth, tenth, thirteenth, eleventh, twelfth, fourteen, and fifteenth field effect transistors are enhancement mode devices.

13. The combination in accordance with claim 12, wherein said field effect transistors are p channel devices, said voltage source is relatively negative with respect to said reference potential and said first and second clock signal first logic state is relatively negative with respect to said second logic state.

14. The combination in accordance with claim 12, further including;

a second stage differential amplifier having a first channel amplifier having an input terminal and an output terminal, said first channel amplifier output terminal being connected to said first differential output terminal, and a second stage differential amplifier second channel amplifier having an input terminal and an output terminal, said second channel amplifier output terminal being connected to said second stage differential amplifier second differential output terminal and having a gain essentially equal to the gain of said second stage differential amplifier first channel amplifier;

a second stage first channel input capacitor having a first and second terminal, said second terminal being connected to said second stage differential amplifier first channel amplifier input terminal, a second stage second channel input capacitor, having a first and second terminal, said second terminal being connected to said second stage differential amplifier second channel amplifier input terminal, said clock signal means having a third clock signal, having a waveform having a first logic state followed by a second logic state, means responsive to said third clock signal for connecting said second stage differential amplifier first and second channel amplifier output terminals to their respective input terminals, said first stage differential amplifier first channel amplifier output terminal being connected to said second stage first channel input capacitor first terminal, said first stage differential amplifier second channel amplifier output terminal being connected to said second stage second channel input capacitor first terminal, whereby said second stage first channel and second channel input capacitors couple said differential output voltage between said first stage differential amplifier first and second channel amplifier output terminals to said second stage differential amplifier first and second channel amplifier input terminals blocking said first stage differential amplifier first and second channel amplifier offset voltage, said second stage differential amplifier providing additional differential gain.

15. The combination in accordance with claim 14, wherein said field effect transistors are p channel devices, said voltage sources relatively negative with respect to said reference potential and said first and second clock signal first logic state is relatively negative with respect to said second logic state.

* * * * *